(12) United States Patent
Happ

(10) Patent No.: US 7,166,533 B2
(45) Date of Patent: Jan. 23, 2007

(54) PHASE CHANGE MEMORY CELL DEFINED BY A PATTERN SHRINK MATERIAL PROCESS

(75) Inventor: Thomas Happ, Pleasantville, NY (US)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 11/101,974

(22) Filed: Apr. 8, 2005

(65) Prior Publication Data
US 2006/0228883 A1    Oct. 12, 2006

(51) Int. Cl.
H01L 21/4763    (2006.01)
(52) U.S. Cl. .................. 438/637; 438/638; 438/646
(58) Field of Classification Search .............. 257/3
See application file for complete search history.

(56) References Cited

U.S. PATENT DOCUMENTS

| | | | |
|---|---|---|---|
| 4,022,932 A | | 5/1977 | Feng |
| 6,383,952 B1 | | 5/2002 | Subramanian et al. |
| 6,486,058 B1 | * | 11/2002 | Chun .................... 438/637 |
| 6,764,946 B1 | * | 7/2004 | Amblard ............... 438/637 |
| 6,872,510 B2 | * | 3/2005 | Lee et al. .............. 430/311 |
| 2002/0006735 A1 | | 1/2002 | Zahorik |
| 2003/0186170 A1 | | 10/2003 | Yamashita |
| 2004/0038549 A1 | | 2/2004 | Arita |
| 2004/0095802 A1 | | 5/2004 | Tran |
| 2004/0113181 A1 | | 6/2004 | Wicker |
| 2004/0229409 A1 | | 11/2004 | Chang et al. |
| 2005/0127347 A1 | * | 6/2005 | Choi et al. .............. 257/2 |
| 2005/0250316 A1 | * | 11/2005 | Choi et al. ............ 438/637 |

FOREIGN PATENT DOCUMENTS

EP    1469532    10/2004

OTHER PUBLICATIONS

S.J. Ahn et al., "Highly Manufacturable High Density Phase Change Memory of 64 Mb and Beyond", IEDM 2004 (6 pgs.).
H.Horii et al., "A novel cell technology using N-doped GeSbTe films for phase change RAM", VLSI, 2003 (2 pgs).
Y.N. Hwang et al., "Full integration and reliability evaluation of phase-change RAM based on 0.24μm-CMOS technologies", VLSI, 2003 (pp. 173-174).
Y.N. Hwang et al., "Writing Current Reduction for High-density Phase-change RAM", IEDM 2003 (4 pgs.)
C.W. Jeong et al., "Switching Current Scaling and Reliability Evaluation in PRAM", IEEE NVSMW, 2004 (pp. 28-29).
H.W. Kim et al., "Analytical study on small contact hole process for sub-65 nm node generation", JVSTB 22(6), L38, 2004 (7 pgs.).
S. Lai, T. Lowery, OUM-a 180 nm nonvolatile memory cell element technology for stand alone and embedded applications, IEDM 2001 (6 pgs.).

(Continued)

Primary Examiner—Thao P. Le
(74) Attorney, Agent, or Firm—Dicke, Billig & Czaja, PLLC

(57) ABSTRACT

One embodiment of the present invention provides a memory cell device. The memory cell device includes a first electrode, a phase-change material adjacent the first electrode, and a second electrode adjacent the phase-change material. The phase-change material has a sublithographic width defined by a pattern shrink material process.

38 Claims, 11 Drawing Sheets

OTHER PUBLICATIONS

Y.H. Ha et al., "An edge contact type cell for phase change RAM reaturing very low power consumption", VLSI, 2003 (2 pgs.).

C. Wallace et al., "Optimization of Resist Shrink Techniques for Contact Hole and Metal Trench ArF Lithography at the 90 nm Technology Node", SPIE, 2004 (9 pgs).

X.M. Yang, H. Gentile, "Shrink assist film for enhanced resolution (SAFIER™) process for printing of 20 nm trenches with high aspect ratio", SPIE 5374, 558, 2004 (10 pgs.).

"0.1um Level Contact Hole Pattern Formation with KrF Lithography by Resolution Enhancement Lithography Assisted by Chemical Shrink (RELACS)", Toshiyuki Toyoshima, et al, 1998. (4 pgs.).

"Electron-beam SAFIER Process and its Application for Magnetic Thin-film Heads", XiaoMin Yang, et al, 2004. (5 pgs).

"Scaling Analysis of Phase-Change Memory Technology", A. Pirovano, et al, 2003. (4 pgs.).

* cited by examiner

PHASE CHANGE MEMORY CELL DEFINED BY A PATTERN SHRINK MATERIAL PROCESS

BACKGROUND

Phase-change memories include phase-change materials that exhibit at least two different states. Phase-change material may be used in a memory cell to store a bit of data. The states of phase-change material may be referenced to as amorphous and crystalline states. The states may be distinguished because the amorphous state generally exhibits higher resistivity than does the crystalline state. Generally, the amorphous state involves a more disordered atomic structure, while the crystalline state is an ordered lattice.

Phase change in the phase-change materials may be induced reversibly. In this way, the memory may change from the amorphous state to the crystalline state, and vice versa, in response to temperature changes. The temperature changes to the phase-change material may be achieved in a variety of ways. For example, a laser can be directed to the phase-change material, current may be driven through the phase-change material, or current or voltage can be fed through a resistive heater adjacent the phase change material. With any of these methods, controllable heating of the phase-change material causes controllable phase change within the phase change-material.

When a phase-change memory comprises a memory array having a plurality of memory cells that are made of phase-change material, the memory may be programmed to store data utilizing the memory states of the phase-change material. One way to read and write data in such a phase-change memory device is to control a current and/or voltage pulse that is applied to the phase-change material. The level of current and voltage generally corresponds to the temperature induced within the phase-change material in each memory cell. To minimize the amount of power that is used in each memory cell, the size of the electrical contact for the phase-change material of the memory cell should be minimized.

SUMMARY

One embodiment of the present invention provides a memory cell device. The memory cell device includes a first electrode, a phase-change material adjacent the first electrode, and a second electrode adjacent the phase-change material. The phase-change material has a sublithographic width defined by a pattern shrink material process.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
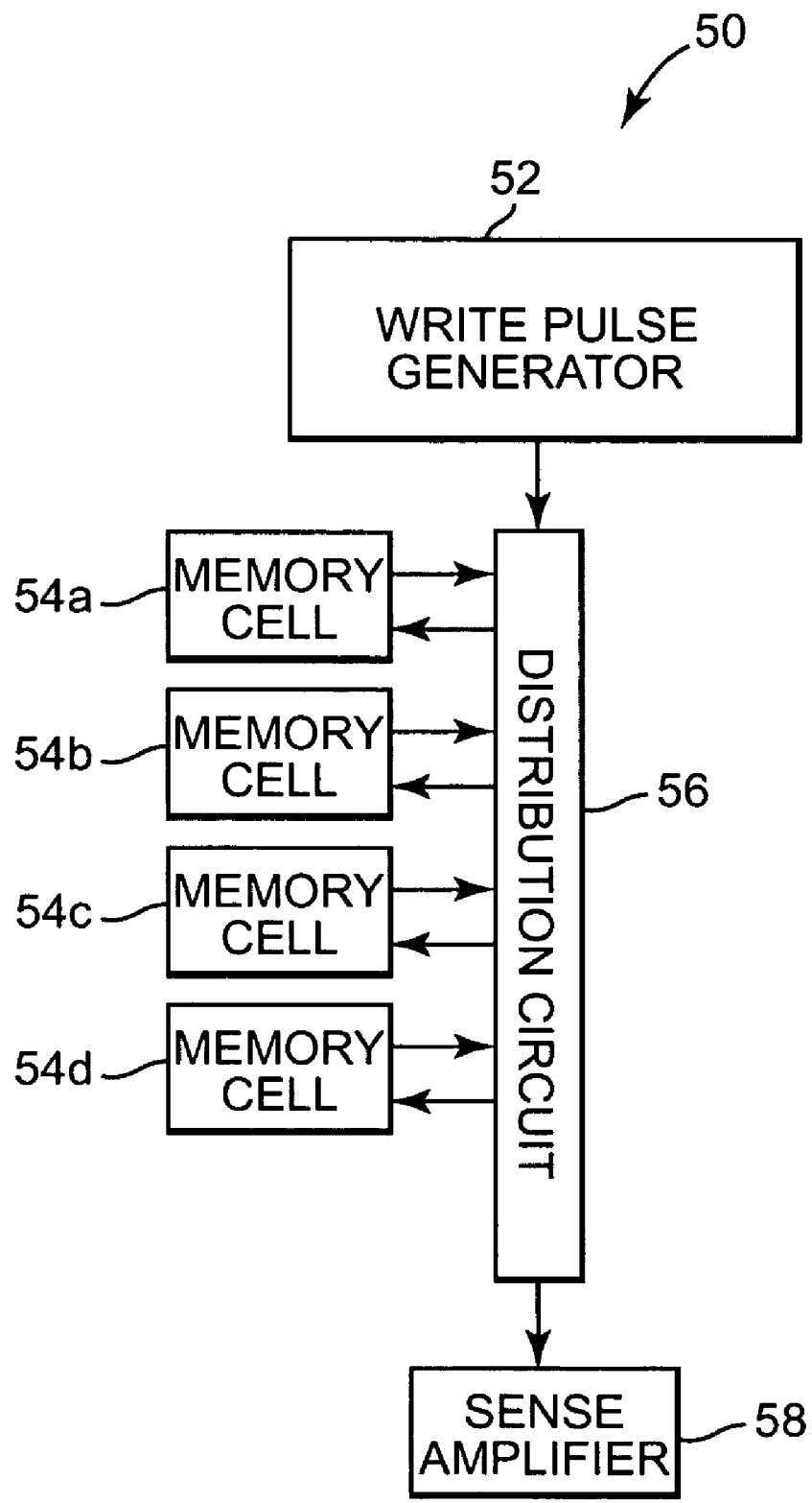
FIG. 1 is a block diagram illustrating one embodiment of a memory cell device.

FIG. 1 is a block diagram illustrating one embodiment of a memory cell device 50. Memory cell device 50 includes write pulse generator 52, distribution circuit 56, memory cells 54a, 54b, 54c, and 54d, and a sense amplifier 58. In one embodiment, memory cells 54a–54d are phase-change memory cells that are based on the amorphous to crystalline phase transition of the memory material. Phase change memory cells 54a–54d are fabricated using a Shrink Assist Film for Enhanced Resolution (SAFIER™) material available from Tokyo Ohka Kogyo Co., Resolution Enhancement Lithography Assisted by Chemical Shrink (RELACS™) material available from AZ Electronic Materials, or other suitable pattern shrink material. Pattern shrink material as used herein is defined as any suitable material that when coated onto patterned photoresist and then heated reduces the line widths of the patterned photoresist. The pattern shrink material provides memory storage locations having a sublithographic width by reducing the width of openings in a patterned photoresist mask used for defining the memory storage locations. Examples of the SAFIER™ process and the RELACS™ process are described in Kim, H. W., "Analytical Study on Small Contact Hole Process for Sub-65 nm Node Generation." JVSTB 22(6), L38, 2004.

In one embodiment, write pulse generator 52 generates current or voltage pulses that are controllably directed to memory cells 54a–54d via distribution circuit 56. In one embodiment, distribution circuit 56 is a plurality of transistors that controllably direct current or voltage pulses to the memory, and in another embodiment, is a plurality of transistors that controllably direct current or voltage pulses to heaters adjacent to the phase-change memory cells.

In one embodiment, memory cells 54a–54d are made of a phase-change material that can be changed from an amorphous state to a crystalline state or from a crystalline state to an amorphous state under influence of temperature change. The degree of crystallinity thereby defines at least two memory states for storing data within memory cell device 50, which can be assigned to the bit values "0" and "1". The bit states of memory cells 54a–54d differ significantly in their electrical resistivity. In the amorphous state, a phase-change material exhibits significantly higher resistivity than in the crystalline state. In this way, sense amplifier 58 reads the cell resistance such that the bit value assigned to a particular memory cell 54a–54d is determined.

To program a memory cell 54a–54d within memory cell device 50, write pulse generator 52 generates a current or voltage pulse for heating the phase-change material in the target memory cell. In one embodiment, write pulse generator 52 generates an appropriate current or voltage pulse, which is fed into distribution circuit 56 and distributed to the appropriate target memory cell 54a–54d. The current or voltage pulse amplitude and duration is controlled depending on whether the memory cell is being set or reset. Generally, a "set" operation of a memory cell is heating the phase-change material of the target memory cell above its crystallization temperature (but below its melting temperature) long enough to achieve the crystalline state. Generally, a "reset" operation of a memory cell is quickly heating the phase-change material of the target memory cell above its melting temperature, and then quickly quench cooling the material, thereby achieving the amorphous state.

Figure 2:
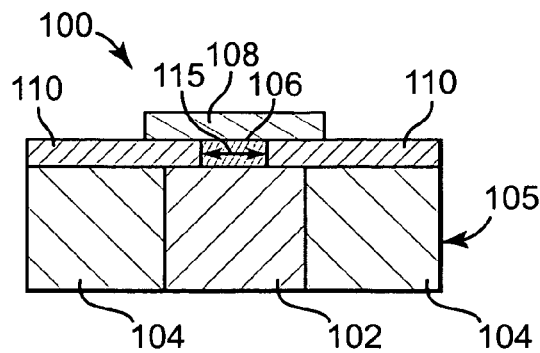
FIG. 2 illustrates a cross-sectional view through one embodiment of a phase-change memory cell.

FIG. 2 illustrates a cross-sectional view through one embodiment of a phase-change memory cell 100. Phase-change memory cell 100 includes a first electrode 102, phase-change material 106, a second electrode 108, insulator material 104, and isolation material 110. In one embodiment, isolation material 110 comprises insulator material 104. Phase-change material 106 provides a storage location for storing one bit or several bits of data. Phase-change material 106 is laterally completely enclosed by isolation material 110, which defines the current path and hence the location of the phase-change region in phase-change material 106. The width 115 of phase-change material 106 is a sublithographic width defined by a SAFIER™ material process, RELACS™ material process, or other suitable pattern shrink material process. A selection device, such as an active device like a transistor or diode, is coupled to first electrode 102 to control the application of current or voltage to first electrode 102, and thus to phase-change material 106, to set and reset phase-change material 106.

In this way, during a set operation of phase-change memory cell 100, a set current or voltage pulse is selectively enabled to phase-change material 106 thereby heating it above its crystallization temperature (but below its melting temperature). In this way, phase-change material 106 reaches its crystalline state during this set operation. During a reset operation of phase-change memory cell 100, a reset current and/or voltage pulse is selectively enabled by the selection device and sent through first electrode 102 to phase-change material 106. The reset current or voltage quickly heats phase-change material 106 above its melting temperature, and then phase-change material 106 is quickly quench cooled to achieve its amorphous state.

In one embodiment, isolation material 110 is a good thermal insulator dielectric material such as a porous oxide film having a thermal conductivity between 0.1 and 0.8 W/mK. In one embodiment, isolation material 110 may be a dielectric material such as Aerogel material with a thermal conductivity of about 0.12–0.18 W/mK, and in another it may be a templated porous oxide dielectric such as Philk with a thermal conductivity of about 0.13–0.17 W/mK.

Phase-change material 106 may be made up of a variety of materials in accordance with the present invention. Generally, chalcogenide alloys that contain one or more elements from Column IV of the periodic table are useful as such materials. In one embodiment, phase-change material 106 of memory cell 100 is made up of a chalcogenide compound material, such as GeSbTe or AgInSbTe. In another embodiment, the phase change material can be chalcogen-free such as GeSb, GaSb or GeGaSb.

The following FIGS. 3–13 illustrate embodiments of a process for fabricating phase-change memory cell 100 using a pattern shrink material, such as SAFIER™ material or RELACS™ material. The figure numbers followed by an "A" illustrate portions of the fabrication process when using SAFIER™ material as the pattern shrink material. The figure numbers followed by a "B" illustrate portions of the fabrication process when using RELACS™ material as the pattern shrink material. The process can also be performed using other pattern shrink materials similar to SAFIER™ material and RELACS™ material.

Figure 3:
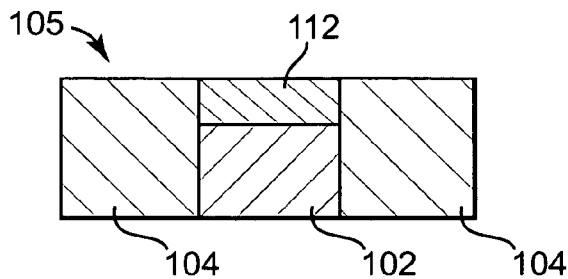
FIG. 3 illustrates a cross-sectional view of one embodiment of a preprocessed wafer.

FIG. 3 illustrates a cross-sectional view of one embodiment of a preprocessed wafer 105. Preprocessed wafer 105 includes insulation material 104, first electrode 102, optional contact material 112, and lower wafer layers (not shown). In other embodiments, contact material 112 is excluded. First electrode 102 is a tungsten plug, copper plug, or another suitable electrode. Insulation material 104 is $SiO_2$ or other suitable insulating material. Contact material 112 comprises Ta, TaN, TiN, or another suitable contact material. Optional contact material 112 is provided in one embodiment by etching first electrode 102 to form a recess, filling the recess with contact material 112, and planarizing to provide preprocessed wafer 105. In other embodiments, contact material 112 is provided using another suitable process.

Figure 4:
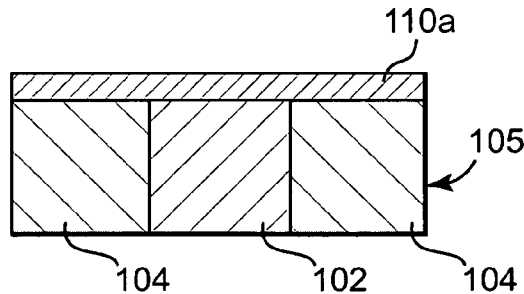
FIG. 4 illustrates a cross-sectional view of one embodiment of the preprocessed wafer and an isolation material layer.

FIG. 4 illustrates a cross-sectional view of one embodiment of preprocessed wafer 105 and an insulation material layer 110a. A planar deposition of isolation material, such as $SiO_2$, a low k material, SiN, or other suitable isolation material, over preprocessed wafer 105 provides isolation material layer 110a. Isolation material layer 110a is deposited using chemical vapor deposition (CVD), atomic layer deposition (ALD), metal organic chemical vapor deposition (MOCVD), plasma vapor deposition (PVD), jet vapor deposition (JVP), or other suitable deposition technique.

Figure 5:
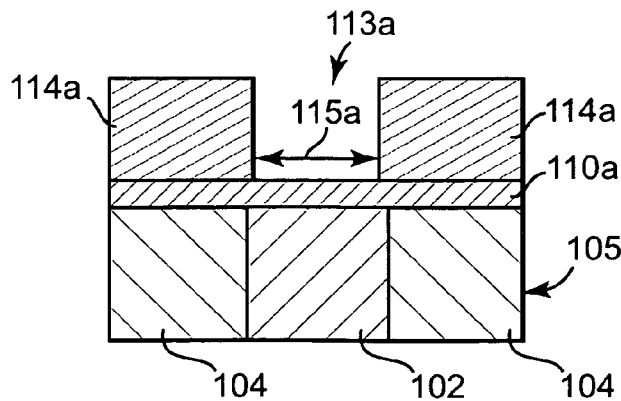
FIG. 5 illustrates a cross-sectional view of one embodiment of the preprocessed wafer, isolation material layer, and a mask layer.

FIG. 5 illustrates a cross-sectional view of one embodiment of preprocessed wafer 105, isolation material layer 110a, and a mask layer 114a. In one embodiment, mask layer 114a is provided by spin coating photoresist onto isolation material layer 110a and performing optical lithography to define mask layer 114a having an opening 113a. In one embodiment, an anti-reflective coating is spin coated onto isolation material layer 110a before applying the photoresist. The anti-reflective coating is removed from opening 113a using a dry etch. In one embodiment, opening 113a is a cylindrical opening above a single first electrode 102. In another embodiment, opening 113a is a trench opening that extends across one or an array of first electrodes 102. Opening 113a is defined by a lithographic width 115a. In one embodiment, opening 113a in mask layer 114a is positioned approximately above the center of first electrode 102.

Figure 6:
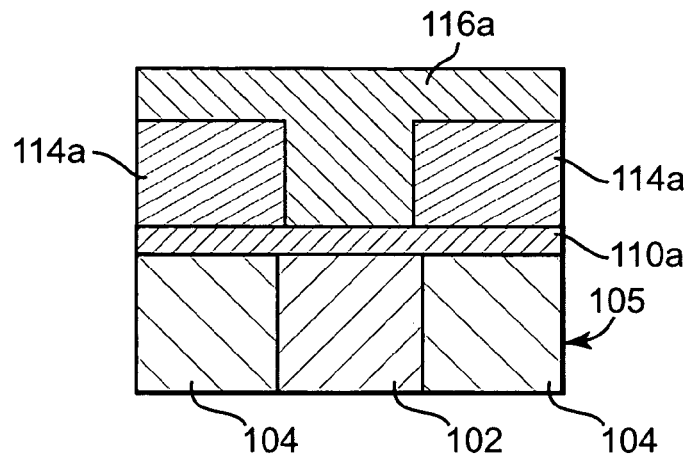
FIG. 6 illustrates a cross-sectional view of one embodiment of the preprocessed wafer, isolation material layer, mask layer, and a pattern shrink material layer.

FIG. 6 illustrates a cross-sectional view of one embodiment of preprocessed wafer 105, isolation material layer 110a, mask layer 114a, and a pattern shrink material layer 116a, such as a SAFIER™ or RELACS™ material layer. Pattern shrink material layer 116a is spin coated or applied using another suitable method onto exposed portions of mask layer 114a and isolation material layer 110a.

Figure 7A:
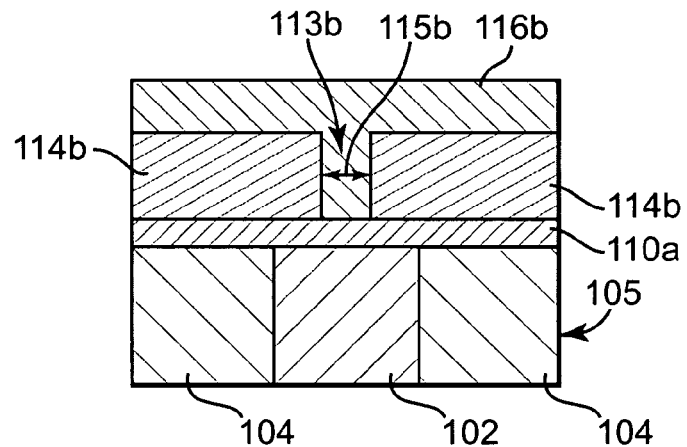
FIG. 7A illustrates a cross-sectional view of one embodiment of the preprocessed wafer, isolation material layer, mask layer, and a SAFIER™ material layer after baking.

FIG. 7A illustrates a cross-sectional view of one embodiment of preprocessed wafer 105, isolation material layer 110a, mask layer 114b, and a SAFIER™ material layer 116b after baking. In one embodiment, preprocessed wafer 105, isolation material layer 110a, mask layer 114a, and SAFIER™ material layer 116a are baked at approximately 150–165° C. for approximately one minute to provide SAFIER™ material layer 116b and mask layer 114b having opening 113b. Opening 113b is defined by a sublithographic width 115b. The baking shrinks SAFIER™ material layer 116a and flows the photoresist of mask layer 114a while maintaining the shape of the sidewalls of opening 113a. The shrink rate and the photoresist profile are a function of the bake temperature. The baking reduces width 115a of opening 113a in mask layer 114a to provide mask layer 114b having opening 113b with width 115b. In one embodiment, the baking is repeated to further reduce the width 115b of opening 113b in mask layer 114b. In one embodiment, the baking reduces the line edge roughness of the sidewalls of opening 113b.

Figure 7B:
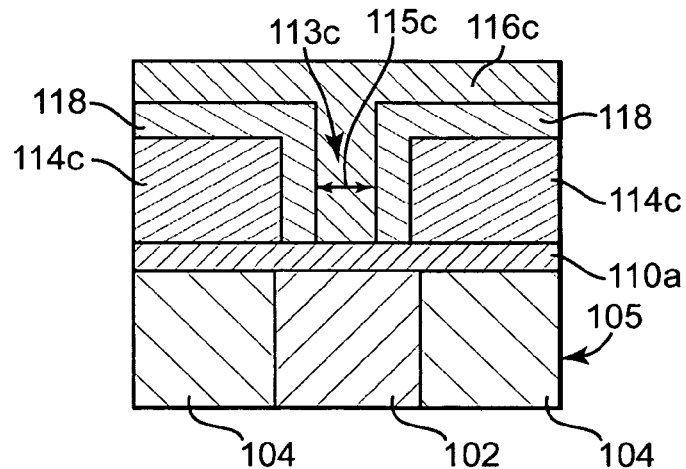
FIG. 7B illustrates a cross-sectional view of one embodiment of the preprocessed wafer, isolation material layer, mask layer, a compound material layer, and a RELACS™ material layer after baking.

FIG. 7B illustrates a cross-sectional view of one embodiment of preprocessed wafer 105, isolation material layer 110a, mask layer 114c, a compound material layer 118, and a RELACS™ material layer 116c after baking. Preprocessed wafer 105, isolation material layer 110a, mask layer 114a, and RELACS™ material layer 116a are baked to provide RELACS™ material layer 116c, a conformal compound material layer 118 and mask layer 114c having opening 113c. Opening 113c is defined by a sublithographic width 115c. The baking reduces the width 115a of opening 113a in mask layer 114a to provide mask layer 114c and conformal compound material layer 118 having opening 113c with width 115c. Conformal compound material layer 118 is produced by a chemical reaction between RELACS™ material layer 116a and the photoresist of mask layer 114a during baking.

Figure 8A:
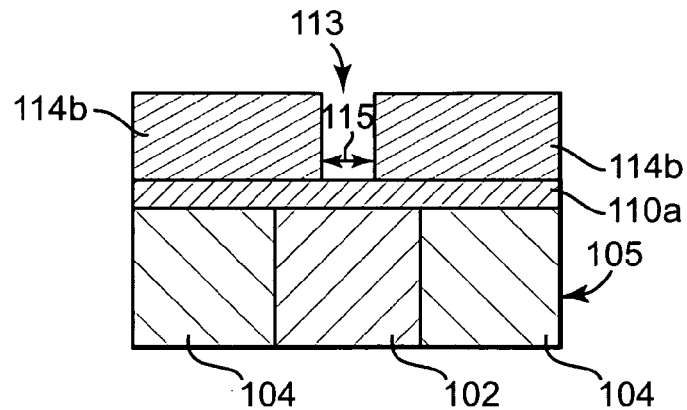
FIG. 8A illustrates a cross-sectional view of one embodiment of the preprocessed wafer, isolation material layer, and mask layer after removing the SAFIER™ material layer.

FIG. 8A illustrates a cross-sectional view of one embodiment of preprocessed wafer 105, isolation material layer 110a, and mask layer 114b after removing SAFIER™ material layer 116b. SAFIER™ material layer 116b is removed using a DI water rinse or another suitable method. In one embodiment, SAFIER™ material is again applied to exposed portions of mask layer 114b and insulation material layer 110a, baked, and removed repeatedly until the desired width 115 of opening 113 in mask layer 114b is obtained.

Figure 8B:
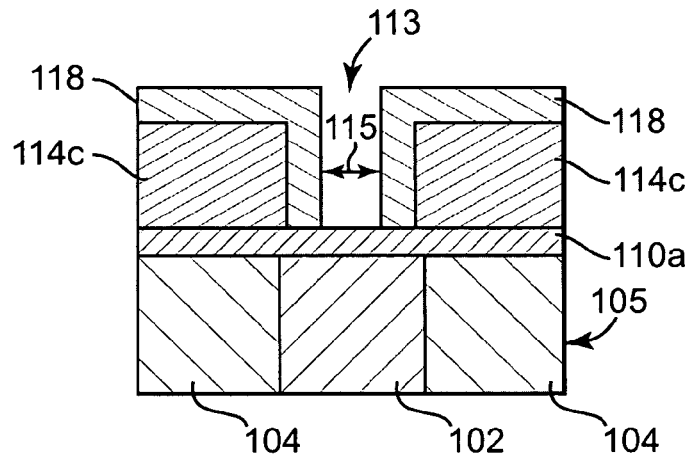
FIG. 8B illustrates a cross-sectional view of one embodiment of the preprocessed wafer, isolation material layer, mask layer, and compound material layer after removing the RELACS™ material layer.

FIG. 8B illustrates a cross-sectional view of one embodiment of preprocessed wafer 105, isolation material layer 110a, mask layer 114c, and compound material layer 118 after removing RELACS™ material layer 116c. RELACS™ material layer 116c is removed using a DI water rinse or another suitable method.

Figure 9:
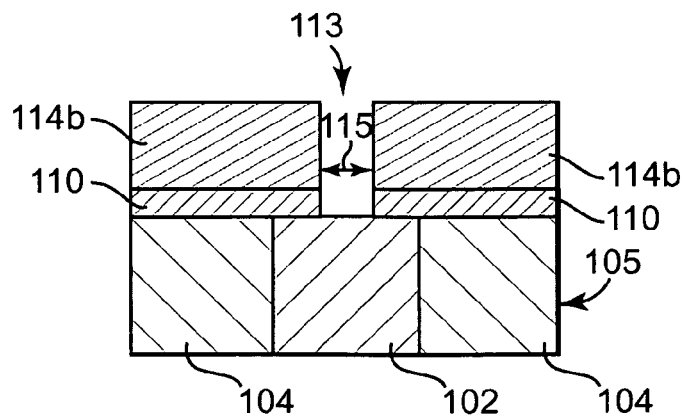
FIG. 9 illustrates a cross-sectional view of one embodiment of the preprocessed wafer, isolation material layer, and mask layer after etching the isolation material layer.

FIG. 9 illustrates a cross-sectional view of one embodiment of preprocessed wafer 105, isolation material layer 110, and mask layer 114b after etching isolation material layer 110a. FIG. 9 illustrates mask layer 114b after removing the SAFIER™ material. For the RELACS™ embodiment, the portion of isolation material layer 110a that is etched is defined by mask layer 114c and compound material layer 118 as illustrated in FIG. 8B. Regardless of whether the SAFIER™ material, RELACS™ material, or another suitable pattern shrink material is used, isolation material layer 110a is etched using a reactive ion etch (RIE) or other suitable etch to provide isolation material layer 110 and expose first electrode 102.

Figure 10:
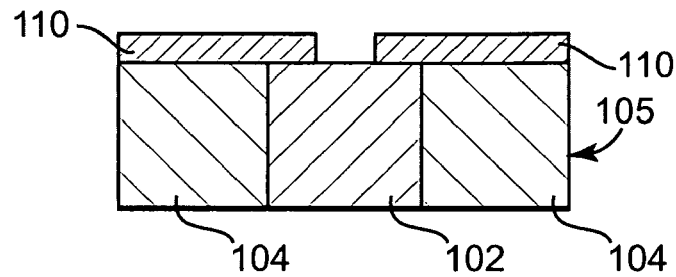
FIG. 10 illustrates a cross-sectional view of one embodiment of the preprocessed wafer and isolation material layer after removing the mask layer.

FIG. 10 illustrates a cross-sectional view of one embodiment of preprocessed wafer 105 and isolation material layer 110 after removal of mask layer 114b or mask layer 114c and compound material layer 118. Mask layer 114b or mask layer 114c and compound material layer 118 are removed using a photoresist stripping process.

Figure 11:
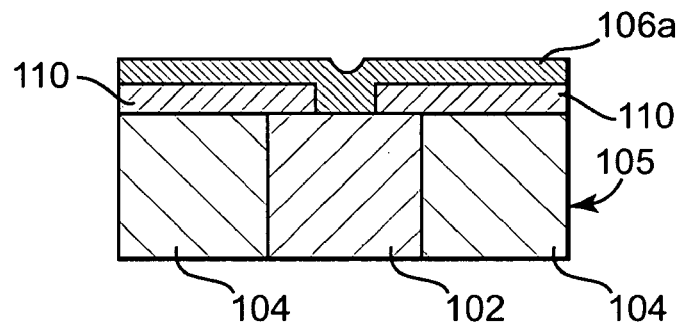
FIG. 11 illustrates a cross-sectional view of one embodiment of the preprocessed wafer, isolation material layer, and a phase-change material layer.

FIG. 11 illustrates a cross-sectional view of one embodiment of preprocessed wafer 105, isolation material layer 110, and a phase-change material layer 106a. Phase-change material, such as a calcogenic compound material or other suitable phase change material, is deposited over exposed portions of isolation material layer 110 and first electrode 102 to provide phase-change material layer 106a. Phase-change material layer 106a is deposited using CVD, ALD, MOCVD, PVD, JVP, or other suitable deposition technique.

Figure 12:
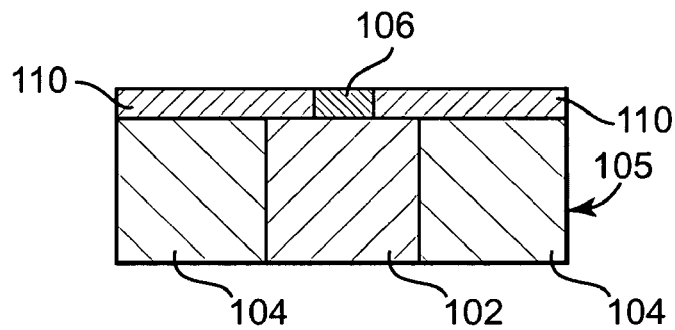
FIG. 12 illustrates a cross-sectional view of one embodiment of the preprocessed wafer, isolation material layer, and phase-change material layer after planarization.

FIG. 12 illustrates a cross-sectional view of one embodiment of preprocessed wafer 105, isolation material layer 110, and phase-change material layer 106 after planarizing phase-change material layer 106a. In one embodiment, phase-change material layer 106a is planarized using chemical mechanical polishing (CMP) or another suitable planarizing technique to provide phase-change material layer 106.

Figure 13:
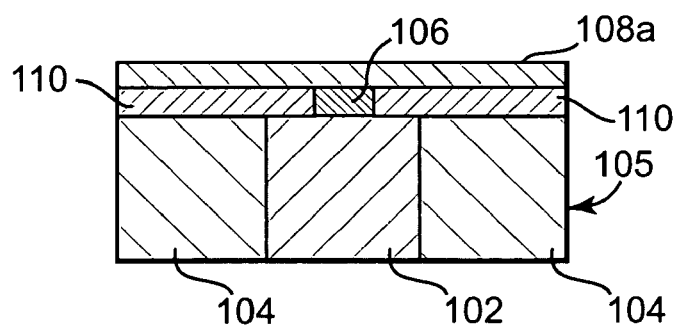
FIG. 13 illustrates a cross-sectional view of one embodiment of the preprocessed wafer, isolation material layer, phase-change material layer, and a second electrode material layer.

FIG. 13 illustrates a cross-sectional view of one embodiment of preprocessed wafer 105, isolation material layer 110, phase-change material layer 106, and a second electrode material layer 108a. A planar deposition of electrode material, such as TiN, TaN, or another suitable electrode material, over phase-change material layer 106 and isolation material layer 110, provides second electrode material layer 108a. Second electrode material layer 108a is etched to provide second electrode 108 and phase-change memory cell 100 as illustrated in FIG. 2. In one embodiment, second electrode 108 provides a landing pad for the next level metallization plug.

Figure 14:
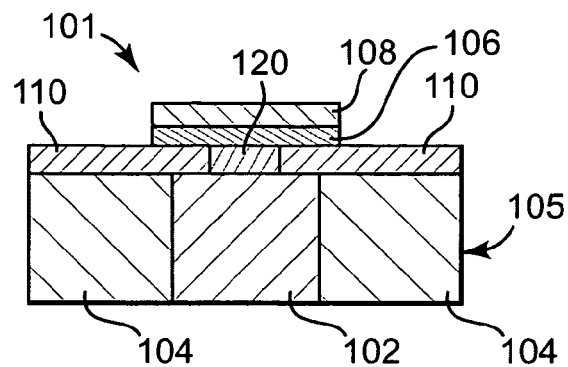
FIG. 14 illustrates a cross-sectional view through one embodiment of a heater phase-change memory cell.

FIG. 14 illustrates a cross-sectional view through one embodiment of a heater phase-change memory cell 101. Heater phase-change memory cell 101 includes a first electrode 102, a heater 120, phase-change material 106, a second electrode 108, insulator material 104, and isolation material 110. In one embodiment, isolation material 110 comprises insulator material 104. Heater 120 is laterally completely enclosed by isolation material 110, which defines the current path and hence the location of the phase-change region in phase-change material 106. Phase-change material 106 provides a storage location for storing one bit or several bits of data. A selection device, such as an active device like a transistor or diode, is coupled to first electrode 102 to control the application of current or voltage to first electrode 102, and thus to heater 120 and phase-change material 106, to set and reset phase-change material 106.

In this way, during a set operation of heater phase-change memory cell 101, a set current or voltage pulse is selectively enabled to heater 120 thereby heating phase-change material 106 above its crystallization temperature (but below its melting temperature). In this way, phase-change material 106 reaches its crystalline state during this set operation. During a reset operation of heater phase-change memory cell 101, a reset current and/or voltage pulse is selectively enabled by the selection device and sent through first electrode 102 to heater 120 and phase-change material 106. The reset current or voltage quickly heats phase-change material 106 above its melting temperature, and then phase-change material 106 is quickly quench cooled to achieve its amorphous state.

The following FIGS. 15–25 illustrate embodiments of a process for fabricating heater phase-change memory cell 101 using a pattern shrink material, such as SAFIER™ material or RELACS™ material. The figure numbers followed by an "A" illustrate portions of the fabrication process for using SAFIER™ material as the pattern shrink material. The figure numbers followed by a "B" illustrate portions of the fabrication process for using RELACS™ material as the pattern shrink material. The process can also be performed using other pattern shrink materials similar to SAFIER™ material and RELACS™ material.

Figure 15:
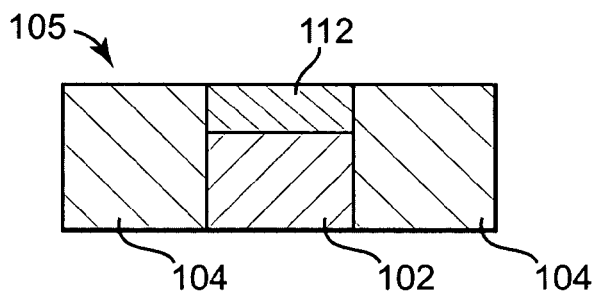
FIG. 15 illustrates a cross-sectional view of one embodiment of a preprocessed wafer.

FIG. 15 illustrates a cross-sectional view of one embodiment of a preprocessed wafer 105. Preprocessed wafer 105 includes insulation material 104, first electrode 102, optional contact material 112, and lower wafer layers (not shown). In other embodiments, contact material 112 is excluded. First electrode 102 is a tungsten plug, copper plug, or another suitable electrode. Insulation material 104 is $SiO_2$ or other suitable insulating material. Contact material 112 comprises Ta, TaN, TiN, or another suitable contact material. Optional contact material 112 is provided in one embodiment by etching first electrode 102 to form a recess, filling the recess with contact material 112, and planarizing to provide preprocessed wafer 105. In other embodiments, contact material 112 is provided using another suitable process.

Figure 16:
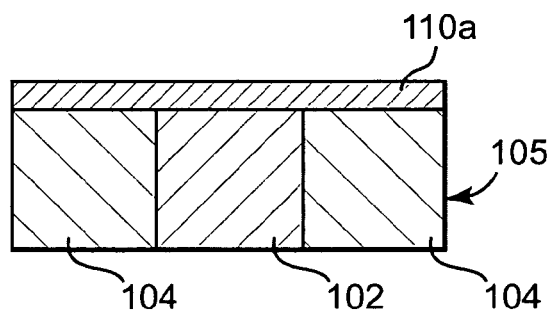
FIG. 16 illustrates a cross-sectional view of one embodiment of the preprocessed wafer and an isolation material layer.

FIG. 16 illustrates a cross-sectional view of one embodiment of preprocessed wafer 105 and an insulation material layer 110a. A planar deposition of isolation material, such as $SiO_2$, a low k material, SiN, or other suitable isolation material, over preprocessed wafer 105 provides isolation material layer 110a. Isolation material layer 110a is deposited using CVD, ALD, MOCVD, PVD, JVP, or other suitable deposition technique.

Figure 17:
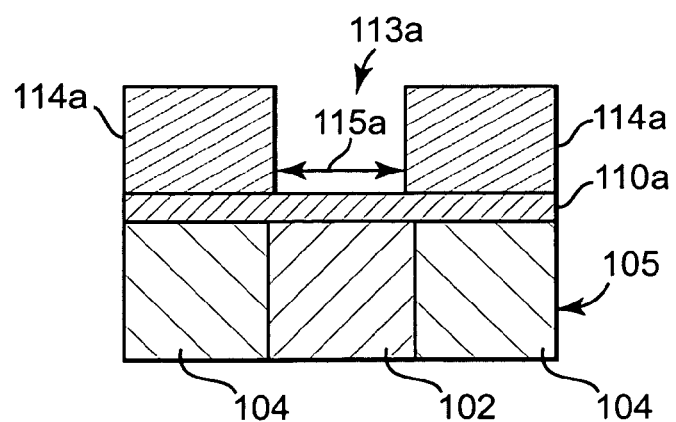
FIG. 17 illustrates a cross-sectional view of one embodiment of the preprocessed wafer, isolation material layer, and a mask layer.

FIG. 17 illustrates a cross-sectional view of one embodiment of preprocessed wafer 105, isolation material layer 110a, and a mask layer 114a. In one embodiment, mask layer 114a is provided by spin coating photoresist onto isolation material layer 110a and performing optical lithography to define mask layer 114a having an opening 113a. In one embodiment, opening 113a is a cylindrical opening above a single first electrode 102. In another embodiment, opening 113a is a trench opening that extends across one or an array of first electrodes 102. Opening 113a is defined by a lithographic width 115a. In one embodiment, opening 113a in mask layer 114a is positioned approximately above the center of first electrode 102.

Figure 18:
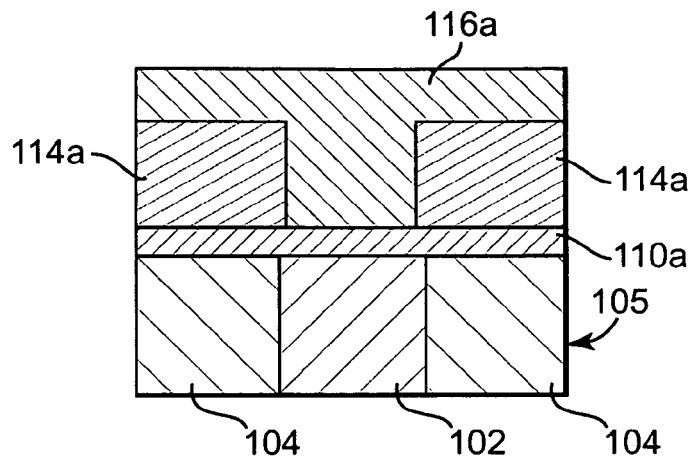
FIG. 18 illustrates a cross-sectional view of one embodiment of the preprocessed wafer, isolation material layer, mask layer, and a pattern shrink material layer.

FIG. 18 illustrates a cross-sectional view of one embodiment of preprocessed wafer 105, isolation material layer 110a, mask layer 114a, and a pattern shrink material layer 116a, such as a SAFIER™ or RELACS™ material layer. Pattern shrink material layer 116a is spin coated or applied using another suitable method onto exposed portions of mask layer 114a and isolation material layer 110a.

Figure 19A:
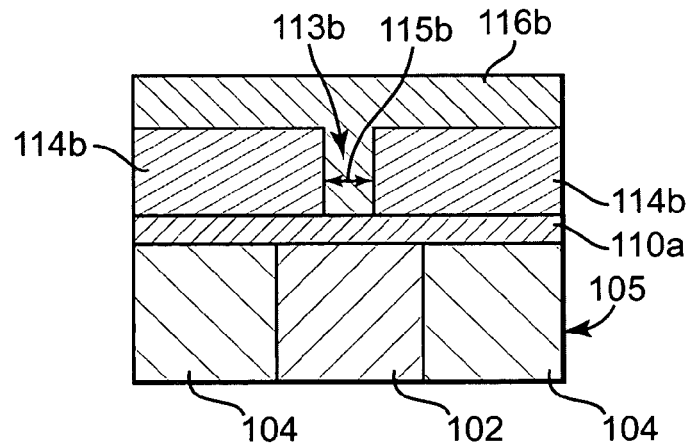
FIG. 19A illustrates a cross-sectional view of one embodiment of the preprocessed wafer, isolation material layer, mask layer, and a SAFIER™ material layer after baking.

FIG. 19A illustrates a cross-sectional view of one embodiment of preprocessed wafer 105, isolation material layer 110a, mask layer 114b, and a SAFIER™ material layer 116b after baking. In one embodiment, preprocessed wafer 105, isolation material layer 110a, mask layer 114a, and SAFIER™ material layer 116a are baked at approximately 150–165° C. for approximately one minute to provide SAFIER™ material layer 116b and mask layer 114b having opening 113b. Opening 113b is defined by a sublithographic width 115b. The baking shrinks SAFIER™ material layer 116a and flows the photoresist of mask layer 114a while maintaining the shape of the sidewalls of opening 113a. The shrink rate and the photoresist profile are a function of the bake temperature. The baking reduces width 115a of opening 113a in mask layer 114a to provide mask layer 114b having opening 113b with width 115b. In one embodiment, the baking is repeated to further reduce the width 115b of opening 113b in mask layer 114b. In one embodiment, the baking reduces the line edge roughness of the sidewalls of opening 113b.

Figure 19B:
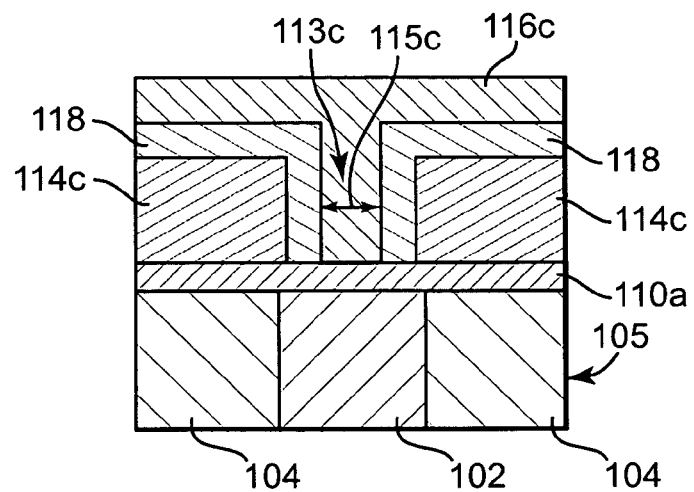
FIG. 19B illustrates a cross-sectional view of one embodiment of the preprocessed wafer, isolation material layer, mask layer, a compound material layer, and a RELACS™ material layer after baking.

FIG. 19B illustrates a cross-sectional view of one embodiment of preprocessed wafer 105, isolation material layer 110a, mask layer 114c, a compound material layer 118, and a RELACS™ material layer 116c after baking. Preprocessed wafer 105, isolation material layer 110a, mask layer 114a, and RELACS™ material layer 116a are baked to provide RELACS™ material layer 116c, a conformal compound material layer 118 and mask layer 114c having opening 113c. Opening 113c is defined by a sublithographic width 115c. The baking reduces the width 115a of opening 113a in mask layer 114a to provide mask layer 114c and conformal compound material layer 118 having opening 113c with width 115c. Conformal compound material layer 118 is produced by a chemical reaction between RELACS™ material layer 116a and the photoresist of mask layer 114a during baking.

Figure 20A:
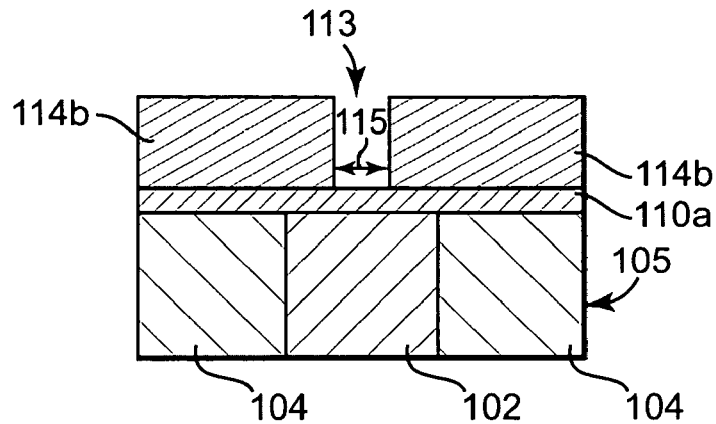
FIG. 20A illustrates a cross-sectional view of one embodiment of the preprocessed wafer, isolation material layer, and mask layer after removing the SAFIER™ material layer.

FIG. 20A illustrates a cross-sectional view of one embodiment of preprocessed wafer 105, isolation material layer 110a, and mask layer 114b after removing SAFIER™ material layer 116b. SAFIER™ material layer 116b is removed using a DI water rinse or another suitable method. In one embodiment, SAFIER™ material is again applied to exposed portions of mask layer 114b and insulation material layer 110a, baked, and removed repeatedly until the desired width 115 of opening 113 in mask layer 114b is obtained.

Figure 20B:
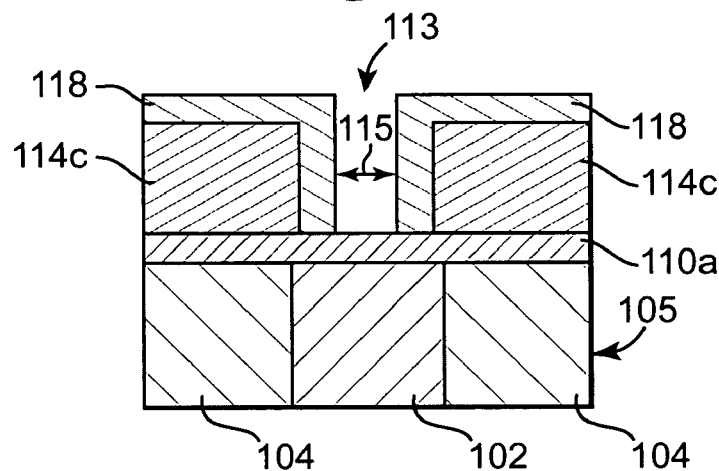
FIG. 20B illustrates a cross-sectional view of one embodiment of the preprocessed wafer, isolation material layer, mask layer, and compound material layer after removing the RELACS™ material layer.

FIG. 20B illustrates a cross-sectional view of one embodiment of preprocessed wafer 105, isolation material layer 110a, mask layer 114c, and compound material layer 118 after removing RELACS™ material layer 116c. RELACS™ material layer 116c is removed using a DI water rinse or another suitable method.

Figure 21:
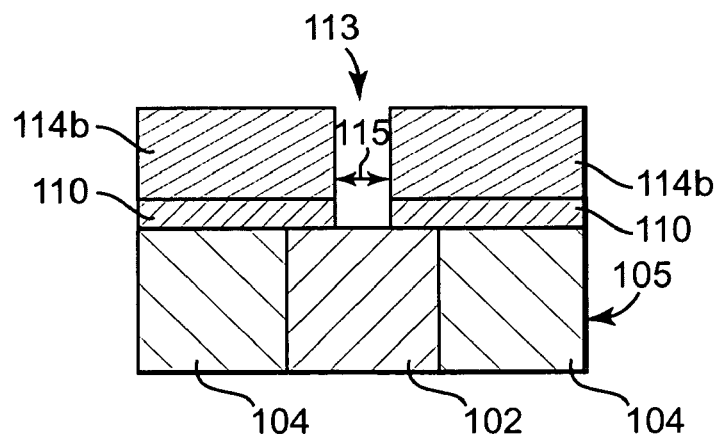
FIG. 21 illustrates a cross-sectional view of one embodiment of the preprocessed wafer, isolation material layer, and mask layer after etching the isolation material layer.

FIG. 21 illustrates a cross-sectional view of one embodiment of preprocessed wafer 105, isolation material layer 110, and mask layer 114b after etching isolation material layer 110a. FIG. 21 illustrates mask layer 114b after removing the SAFIER™ material. For the RELACS™ embodiment, the portion of isolation material layer 110a that is etched is defined by mask layer 114c and compound material layer 118 as illustrated in FIG. 20B. Regardless of whether the SAFIER™ material, RELACS™ material, or another suitable pattern shrink material is used, isolation material layer 110a is etched using a RIE etch or other suitable etch to provide isolation material layer 110 and expose first electrode 102.

Figure 22:
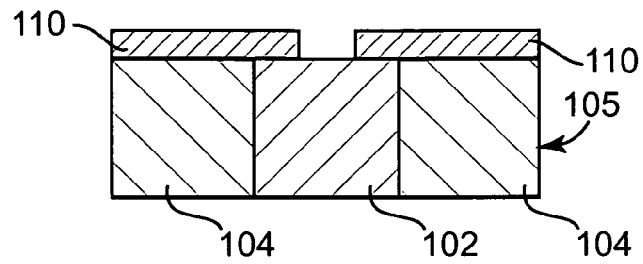
FIG. 22 illustrates a cross-sectional view of one embodiment of the preprocessed wafer and isolation material layer after removing the mask layer.

FIG. 22 illustrates a cross-sectional view of one embodiment of preprocessed wafer 105 and isolation material layer 110 after removal of mask layer 114b or mask layer 114c and compound material layer 118. Mask layer 114b or mask layer 114c and compound material layer 118 are removed using a photoresist stripping process.

Figure 23:
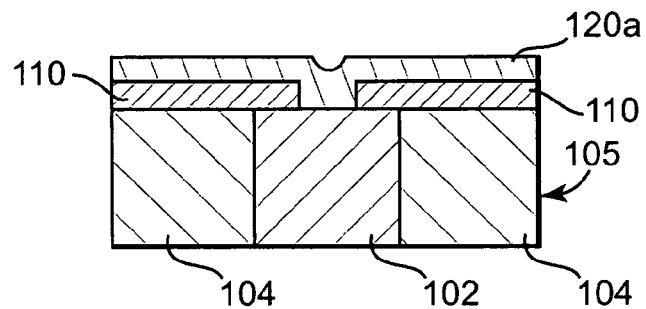
FIG. 23 illustrates a cross-sectional view of one embodiment of the preprocessed wafer, isolation material layer, and a heater material layer.

FIG. 23 illustrates a cross-sectional view of one embodiment of preprocessed wafer 105, isolation material layer 110, and a heater material layer 120a. Heater material, such as TiN, TaN, or another suitable heater material is deposited over exposed portions of isolation material layer 110 and first electrode 102 using CVD, ALD, MOCVD, PVD, JVD, or other suitable deposition technique.

Figure 24:
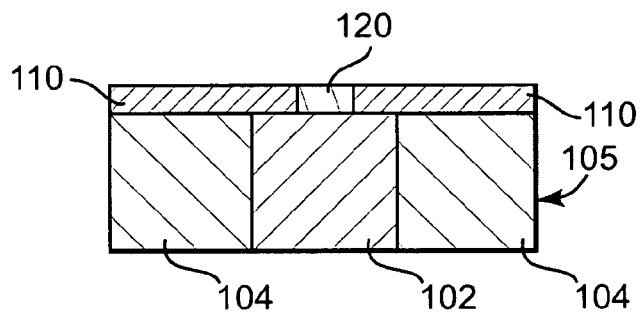
FIG. 24 illustrates a cross-sectional view of one embodiment of the preprocessed wafer, isolation material layer, and heater material layer after planarization.

FIG. 24 illustrates a cross-sectional view of one embodiment of preprocessed wafer 105, isolation material layer 110, and heater material layer 120 after planarizing heater material layer 120a to expose isolation material layer 110. In one embodiment, heater material layer 120a is planarized using. CMP or other suitable planarization method to provide heater material layer 120.

Figure 25:
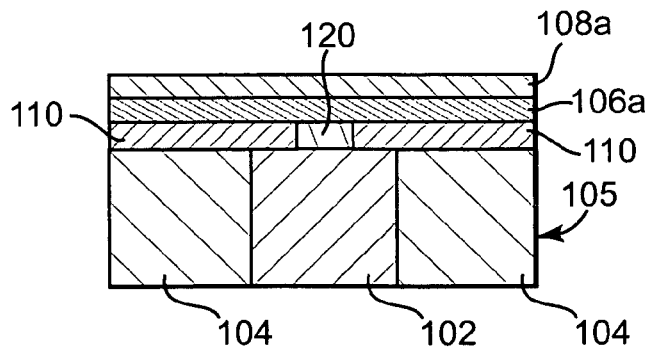
FIG. 25 illustrates a cross-sectional view of one embodiment of the preprocessed wafer, isolation material layer, a phase-change material layer, and a second electrode material layer.

FIG. 25 illustrates a cross-sectional view of one embodiment of preprocessed wafer 105, isolation material layer 110, heater material layer 120, a phase-change material layer 106a, and a second electrode material layer 108a. A planar deposition of phase-change material, such as a calcogenic compound material or another suitable phase-change material, over isolation material layer 110 and heater material layer 120 provides phase-change material layer 106a. A planar deposition of electrode material, such as TiN, TaN, or another suitable electrode material, over phase-change material layer 106a provides second electrode material layer 108a. Phase-change material layer 106a and second electrode material layer 108a are deposited using CVD, ALD, MOCVD, PVD, JVP, or other suitable deposition technique. Second electrode material layer 108a and phase-change material layer 106a are etched to provide second electrode 108 and phase-change material 106 as illustrated in FIG. 14. In one embodiment, second electrode 108 provides a landing pad for the next level metallization plug.

Figure 26:
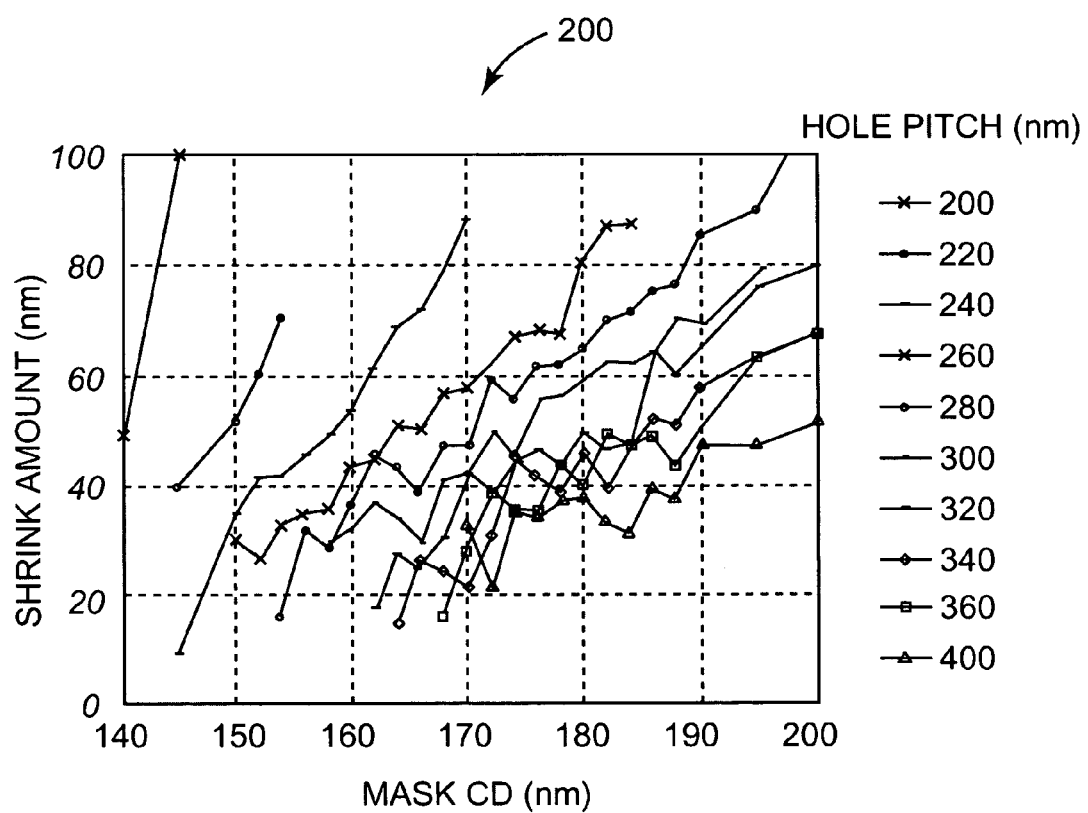
FIG. 26 is a plot illustrating one embodiment of the correlation between the mask critical dimension and hole pitch to the shrink amount for the SAFIER™ process.

FIG. 26 is a plot 200 illustrating one embodiment of the correlation between the mask critical dimension and hole pitch to the shrink amount for the SAFIER™ process. As illustrated in plot 200, as the mask critical dimension increases, the shrink amount also increases. By increasing the shrink amount based on the increase in the mask critical dimension, errors in the mask critical dimension are compensated for using the SAFIER™ process. Therefore, relatively small fluctuations in the critical dimension of the mask are not amplified into relatively large fluctuations after the lithographic process is complete since larger holes shrink more than smaller holes using the SAFIER™ process.

Figure 27:
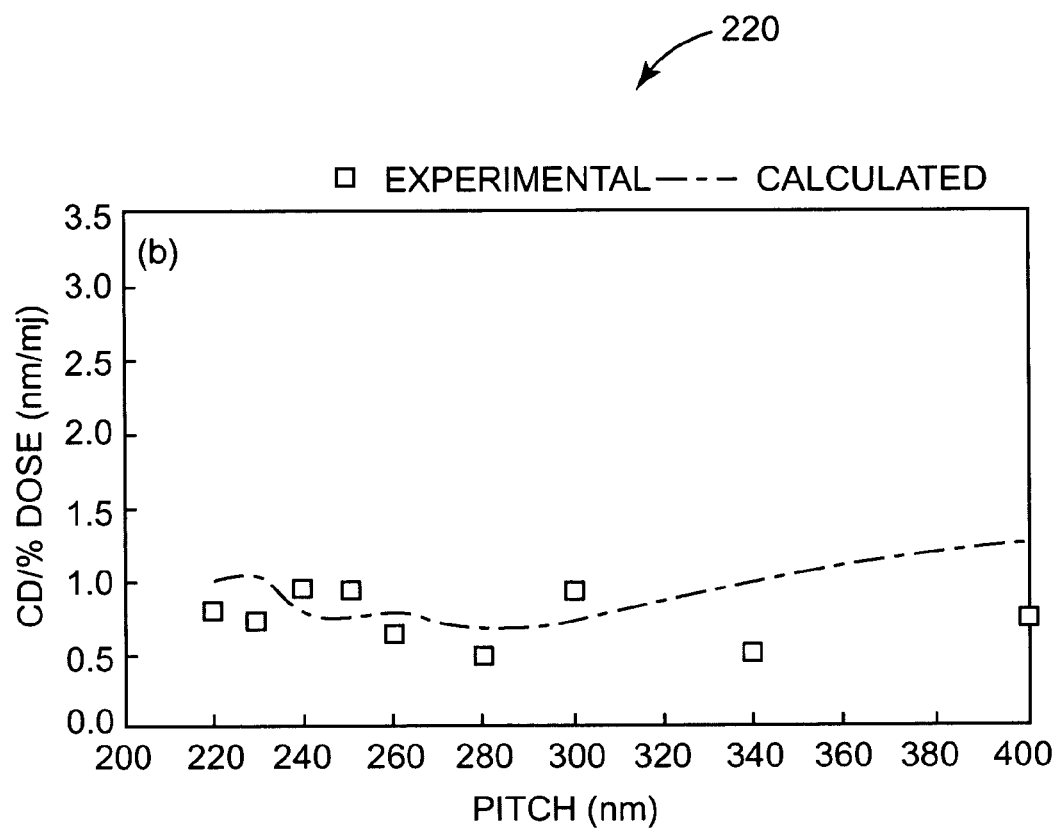
FIG. 27 is a plot illustrating one embodiment of the correlation between the hole pitch to the critical dimension percentage dose for the SAFIER™ process.

FIG. 27 is a plot 220 illustrating one embodiment of the correlation between the hole pitch to the critical dimension percentage dose for the SAFIER™ process. As illustrated in plot 220, the critical dimension percentage dose for the SAFIER™ process is fairly independent of the hole pitch. This characteristic of the SAFIER™ process improves the stability of the process.

Embodiments of the present invention provide phase-change memory cells having storage locations with sublithographic dimensions by using pattern shrink material processes. By reducing the size of the memory cells, the amount of power that is used in each memory cell can be reduced.

What is claimed is:

1. A method for fabricating a memory cell device, the method comprising:
    providing a preprocessed wafer having a first electrode;
    depositing an isolation material layer adjacent the preprocessed wafer;
    applying photoresist adjacent the isolation material layer;
    patterning an opening having a first width in the photoresist;
    applying a pattern shrink material layer over the photoresist and the opening;
    reducing the first width to a second width while maintaining a shape of sidewalls of the opening using the pattern shrink material layer;
    removing the pattern shrink material layer;
    etching the isolation material layer to expose the first electrode;
    removing the photoresist;
    depositing phase-change material in the opening; and
    fabricating a second electrode adjacent the phase-change material.

2. A method for fabricating a memory cell device, the method comprising:
    providing a preprocessed wafer having a first electrode;
    depositing an isolation material layer adjacent the preprocessed wafer;
    applying photoresist adjacent the isolation material layer;
    patterning an opening having a first width in the photoresist;
    applying a first pattern shrink material layer over the photoresist and the opening;

baking to reduce the first width to a second width;
removing the first pattern shrink material layer;
etching the isolation material layer to expose the first electrode;
removing the photoresist;
depositing phase-change material in the opening; and
fabricating a second electrode adjacent the phase-change material.

3. The method of claim 2, further comprising:
applying a second pattern shrink material layer over the photoresist and the opening;
baking to reduce the second width to a third width; and
removing the second pattern shrink material layer.

4. The method of claim 2, wherein applying the first pattern shrink material layer comprises applying a SAFIER™ material layer.

5. The method of claim 4, wherein baking comprises baking the SAFIER™ material layer to shrink the SAFIER™ material and flow the photoresist.

6. The method of claim 2, wherein applying the first pattern shrink material layer comprises applying a RELACS™ material layer.

7. The method of claim 6, wherein baking comprises baking the RELACS™ material layer to form a compound layer with the photoresist.

8. The method of claim 2, wherein depositing the phase-change material comprises depositing a chalcogenide.

9. The method of claim 2, wherein providing the preprocessed wafer comprises providing a preprocessed wafer comprising one of a tungsten plug and a copper plug.

10. The method of claim 2, wherein patterning the opening comprises patterning a cylindrical opening.

11. The method of claim 2, wherein patterning the opening comprises patterning a trench opening.

12. A method for fabricating a memory cell device, the method comprising:
providing a preprocessed wafer having a first electrode;
depositing an isolation material layer adjacent the preprocessed wafer;
applying photoresist adjacent the isolation material layer;
patterning an opening having a first width in the photoresist;
applying a pattern shrink material layer over the photoresist and the opening;
reducing the first width to a second width while maintaining a shape of sidewalls of the opening using the pattern shrink material layer;
removing the pattern shrink material layer;
etching the isolation material layer to expose the first electrode;
removing the photoresist;
depositing heater material in the opening;
depositing a phase-change material layer adjacent the heater material;
depositing an electrode material layer adjacent the phase-change material layer; and
etching the electrode material layer and the phase-change material layer to form a second electrode and a memory storage location.

13. A method for fabricating a memory cell device, the method comprising:
providing a preprocessed wafer having a first electrode;
depositing an isolation material layer adjacent the preprocessed wafer;
applying photoresist adjacent the isolation material layer;
patterning an opening having a first width in the photoresist;
applying a first pattern shrink material layer over the photoresist and the opening;
baking to reduce the first width to a second width;
removing the first pattern shrink material layer;
etching the isolation material layer to expose the first electrode;
removing the photoresist;
depositing heater material in the opening;
depositing a phase-change material layer adjacent the heater material;
depositing an electrode material layer adjacent the phase-change material layer; and
etching the electrode material layer and the phase-change material layer to form a second electrode and a memory storage location.

14. The method of claim 13, further comprising
applying a second pattern shrink material layer over the photoresist and the opening;
baking to reduce the second width to a third width; and
removing the second pattern shrink material layer.

15. The method of claim 13, wherein applying the first pattern shrink material layer comprises applying a SAFIER™ material layer.

16. The method of claim 15, wherein baking comprises baking the SAFIER™ material layer to shrink the SAFIER material and flow the photoresist.

17. The method of claim 13, wherein applying the first pattern shrink material layer comprises applying a RELACS™ material layer.

18. The method of claim 17, wherein baking comprises baking the RELACS™ material layer to form a compound layer with the photoresist.

19. The method of claim 13, wherein depositing the phase-change material comprises depositing a chalcogenide.

20. The method of claim 13, wherein providing the preprocessed wafer comprises providing a preprocessed wafer comprising one of a tungsten plug and a copper plug.

21. The method of claim 13, wherein patterning the opening comprises patterning a cylindrical opening.

22. The method of claim 13, wherein patterning the opening comprises patterning a trench opening.

23. A method for fabricating a memory cell device, the method comprising:
providing a preprocessed wafer having a first electrode;
depositing an isolation material layer adjacent the preprocessed wafer;
applying photoresist adjacent the isolation material layer;
patterning an opening having a first width in the photoresist;
applying a SAFIER™ material layer over the photoresist and the opening;
baking the SAFIER material layer to shrink the SAFIER material and flow the photoresist;
removing the SAFIER material layer to provide the opening having a second width less than the first width;
etching the isolation material layer to expose the first electrode;
removing the photoresist;
depositing phase-change material in the opening; and
fabricating a second electrode adjacent the phase-change material.

24. The method of claim 23, wherein depositing the phase-change material comprises depositing a chalcogenide.

25. The method of claim 23, wherein patterning the opening comprises patterning a cylindrical opening.

26. The method of claim 23, wherein patterning the opening comprises patterning a trench opening.

27. A method for fabricating a memory cell device, the method comprising:
   providing a preprocessed wafer having a first electrode;
   depositing an isolation material layer adjacent the preprocessed wafer;
   applying photoresist adjacent the isolation material layer;
   patterning an opening having a first width in the photoresist;
   applying a RELACS™ material layer over the photoresist and the opening;
   baking the RELACS material layer to form a compound layer with the photoresist;
   removing the RELACS material layer without removing the compound layer to provide the opening having a second width less than the first width;
   etching the isolation material layer to expose the first electrode;
   removing the compound layer and the photoresist;
   depositing phase-change material in the opening; and
   fabricating a second electrode adjacent the phase-change material.

28. The method of claim 27, wherein depositing the phase-change material comprises depositing a chalcogenide.

29. The method of claim 27, wherein patterning the opening comprises patterning a cylindrical opening.

30. The method of claim 27, wherein patterning the opening comprises patterning a trench opening.

31. A method for fabricating a memory cell device, the method comprising:
   providing a preprocessed wafer having a first electrode;
   depositing an isolation material layer adjacent the preprocessed wafer;
   applying photoresist adjacent the isolation material layer;
   patterning an opening having a first width in the photoresist;
   applying a SAFIER™ material layer over the photoresist and the opening;
   baking the SAFIER material layer to shrink the SAFIER material and flow the photoresist;
   removing the SAFIER material layer to provide the opening having a second width less than the first width;
   etching the isolation material layer to expose the first electrode;
   removing the photoresist;
   depositing heater material in the opening;
   depositing a phase-change material layer adjacent the heater material;
   depositing an electrode material layer adjacent the phase-change material layer; and
   etching the electrode material layer and the phase-change material layer to form a second electrode and a memory storage location.

32. The method of claim 31, wherein depositing the phase-change material layer comprises depositing a chalcogenide material layer.

33. The method of claim 31, wherein patterning the opening comprises patterning a cylindrical opening.

34. The method of claim 31, wherein patterning the opening comprises patterning a trench opening.

35. A method for fabricating a memory cell device, the method comprising:
   providing a preprocessed wafer having a first electrode;
   depositing an isolation material layer adjacent the preprocessed wafer;
   applying photoresist adjacent the isolation material layer;
   patterning an opening having a first width in the photoresist;
   applying a RELACS™ material layer over the photoresist and the opening;
   baking the RELACS material layer to form a compound layer with the photoresist;
   removing the RELACS material layer without removing the compound layer to provide the opening having a second width less than the first width;
   etching the isolation material layer to expose the first electrode;
   removing the compound layer and the photoresist;
   depositing heater material in the opening;
   depositing a phase-change material layer adjacent the heater material;
   depositing an electrode material layer adjacent the phase-change material layer; and
   etching the electrode material layer and the phase-change material layer to form a second electrode and a memory storage location.

36. The method of claim 35, wherein depositing the phase-change material layer comprises depositing a chalcogenide material layer.

37. The method of claim 35, wherein patterning the opening comprises patterning a cylindrical opening.

38. The method of claim 35, wherein patterning the opening comprises patterning a trench opening.

* * * * *